United States Patent [19]

Yamauchi et al.

[11] Patent Number: 5,285,414
[45] Date of Patent: Feb. 8, 1994

[54] SEMICONDUCTOR MEMORY HAVING TRANSISTORS WHICH DRIVE DATA LINES IN ACCORDANCE WITH VALUES OF WRITE DATA AND COLUMN SELECT SIGNAL

[75] Inventors: Tatsumi Yamauchi; Masahiro Iwamura, both of Hitachi; Kazutaka Mori, Tokyo, all of Japan

[73] Assignee: Hitachi, Ltd., Tokyo, Japan

[21] Appl. No.: 765,838

[22] Filed: Sep. 26, 1991

[30] Foreign Application Priority Data

Sep. 26, 1990 [JP] Japan .................... 2-256401
Feb. 12, 1991 [JP] Japan .................... 3-018592

[51] Int. Cl.$^5$ ............................. G11C 11/40
[52] U.S. Cl. ...................... 365/189.01; 365/203; 365/189.11
[58] Field of Search ............... 365/49, 189.11, 189.09, 365/190, 207, 208, 203, 189.01, 189.05

[56] References Cited

U.S. PATENT DOCUMENTS

| 4,638,461 | 2/1987 | Yonezu et al. | 365/203 |
| 4,811,301 | 3/1989 | Houston | 365/104 |
| 4,933,905 | 6/1990 | Ootani | 365/203 |
| 4,985,864 | 2/1991 | Price | 365/203 |
| 5,157,631 | 10/1992 | Shimogawa | 365/203 |

FOREIGN PATENT DOCUMENTS

| 188097 | 8/1987 | Japan | 365/203 |
| 63-119096 | 5/1988 | Japan . | |

OTHER PUBLICATIONS

IEEE 1991 Custom Integrated Circuits Conference, pp. 10.4.1-10.4.4.
IEEE 1991 Custom Integrated Circuits Conference, pp. 10.2.1-10.2.4.
IEEE 1991 Custom Integrated Circuits Conference, pp. 14.3.1-14.3.4.
1988 IEEE International Solid-State Circuits Conference, pp. 186-187.
1989 IEEE International Solid-State Circuits Conference, pp. 28-29.
IEEE 1989 Custom Integrated Circuits Conference, pp. 10.2.1-10.2.5.

*Primary Examiner*—Eugene R. LaRoche
*Assistant Examiner*—Vu A. Le
*Attorney, Agent, or Firm*—Antonelli, Terry, Stout & Kraus

[57] ABSTRACT

A semiconductor memory comprises a write driver which is provided to correspond to respective data line and by which data lines connected with a memory cell through the control of a word line are driven in a write operation. The write driver includes MOSFETs of first group and MOSFETs of second group. In a case where a write enable signal does not designate the write operation, the MOSFETs of the first group are normally in ON states to pull up the data lines. Besides, in a case where the write enable signal designates the write operation, each of them operates in accordance with the value of input data, to maintain the ON states and pull up the corresponding data line in case of driving the data line to a "high" level and to fall into OFF states in case of driving the data line to a "low" level. On the other hand, the MOSFETs of the second group are normally in OFF states. Besides, in the case where the write enable signal designates the write operation, each of them operates in accordance with the value of the input data, to fall into ON state and draw the corresponding data line to the low level in the case of driving the data lines to the low level.

13 Claims, 12 Drawing Sheets

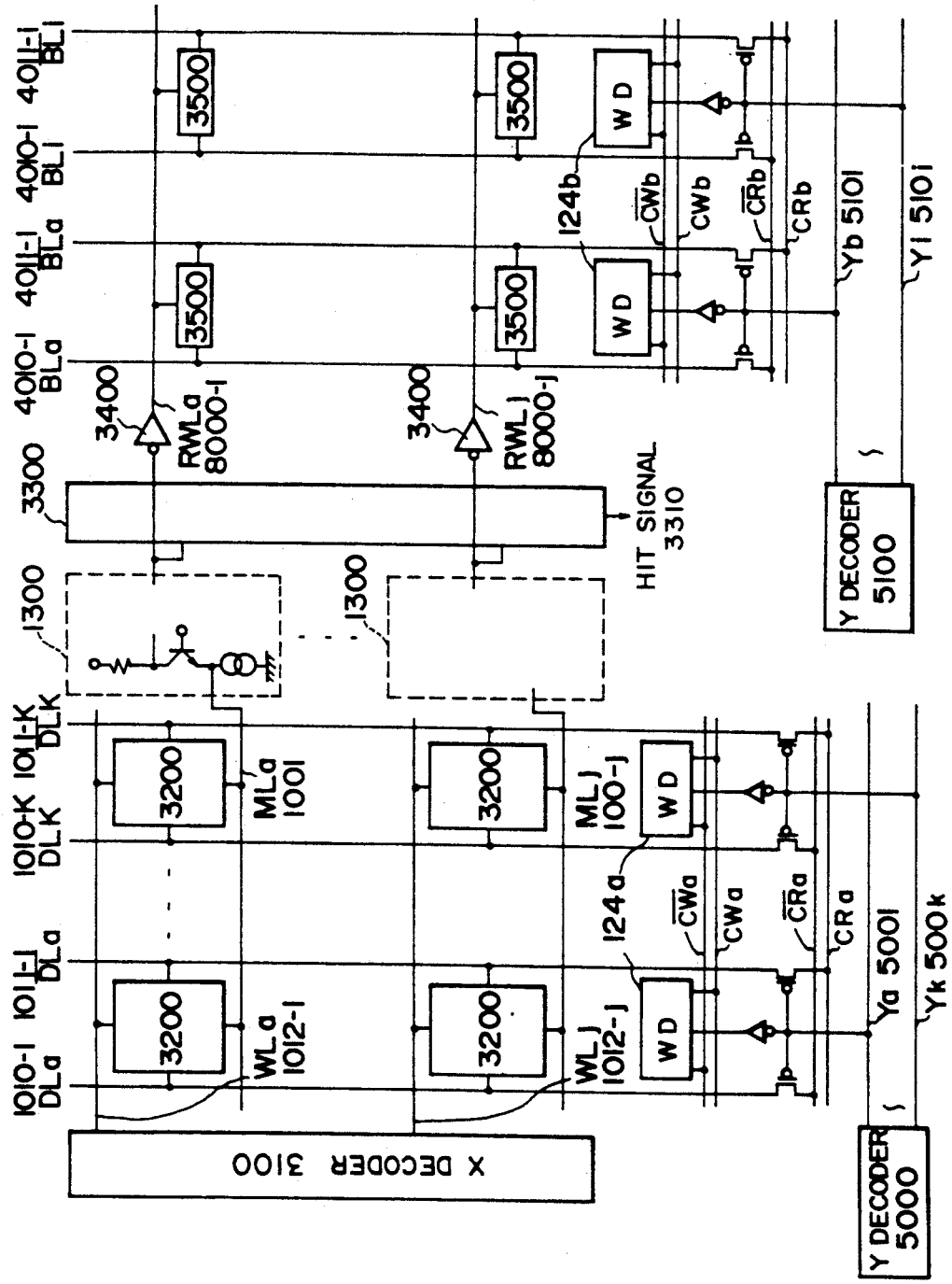

SEMICONDUCTOR MEMORY HAVING TRANSISTORS WHICH DRIVE DATA LINES IN ACCORDANCE WITH VALUES OF WRITE DATA AND COLUMN SELECT SIGNAL

BACKGROUND OF THE INVENTION

1. Field of the Invention

The present invention relates to a semiconductor memory and, more particularly, to a memory-cell peripheral circuit for raising the operating speed of the semiconductor memory.

2. Description of the Related Art

A known memory cell peripheral circuit in a semiconductor memory is disclosed in "1989, IEEE INTERNATIONAL SOLID-STATE CIRCUITS CONFERENCE, DIGEST OF TECHNICAL PAPERS", PP28–29.

FIG. 4 shows the arrangement of this memory-cell peripheral circuit in the prior art.

Referring to the figure, numerals 201 and 202 indicate PMOSFETs of low driving ability which are normally "on", and numerals 401 and 402 indicate PMOSFETs of high driving ability.

The PMOSFETs 201, 202, 401 and 402 constitute a data line load circuit. Applied to the data-line load circuit is a write enable signal WEa 340, which is set at a "high" level in a write mode and at a "low" level at any other time. Symbol WL 120 denotes a word line. A memory cell MC 121 is configured of PMOSFETs 101 and 102, and NMOSFETs 103, 104, 105 and 106. Symbols DL 123 and $\overline{DL}$ 122 denote a pair of data lines which are opposite in polarity to each other, and which are respectively connected to common write lines CW 342 and $\overline{CW}$ 343 through writing column switches 403 and 404. By the way, in this specification, a signal $\overline{X}$ shall express a signal which is opposite in polarity to a signal X.

In addition, the data lines DL 123 and $\overline{DL}$ 122 are respectively connected to common read lines CR 129 and $\overline{CR}$ 130 through reading column switches 113 and 114. A column select signal $\overline{Yi}$ 131 is applied for controlling the reading column switches 113 and 114. Shown at numeral 405 is an inverter circuit which receives the column select signal $\overline{Yi}$ 131 as an input, and the output signal of which controls the writing column switches 403 and 404.

A write enable signal WEb 341 is similar to the signal WEa 340. Write data DIN 125 is directly input to a write driver 407, while it is input to a write driver 406 through an inverter circuit 408 for producing the inverted signal of this write data.

In the circuit shown in FIG. 4, the data is written into the memory cell in such a way that the memory cell MC 121 to be accessed is selected by setting the word line WL 120 at the high level and the column select signal $\overline{Yi}$ 131 at the low level, and that the write enable signals WEa 340 and WEb 341 are changed from the low level to the high level.

When the write enable signal WEb 341 has become the high level, the data items are propagated to the common write lines CW 342 and $\overline{CW}$ 343 by the respective write drivers 406 and 407.

That is, in a state in which the common write lines CW 342 and $\overline{CW}$ 343 are both initially at the high level, the signal of only one of them changes to the low level. Then, the data items of the common write lines CW 342 and $\overline{CW}$ 343 are respectively written into the memory cell MC 121 through the corresponding writing column switches 403 and 404 and data lines DL 123 and $\overline{DL}$ 122.

When the data items are to be written, the write enable signal WEa 340 is also changed from the low level to the high level. This is intended to turn "off" the PMOSFETs of high driving ability 401 and 402 which pulls up the respective data lines DL 123 and $\overline{DL}$ 122 to the high level and thereby making it easy for the potentials of these data lines to be changed to the low level. Thus, the data writing mode is quickened, and the conflict between the data-line load circuit and the write drivers 406, 407 can be prevented from occurring in the data writing mode.

When the write mode has ended, the write enable signals WEa 340 and WEb 341 are changed from the high level to the low level. Thus, the common write lines CW 342 and $\overline{CW}$ 343 are both changed to the high level. Also the data lines DL 123 and $\overline{DL}$ 122 are recovered from the low level in the write mode to the high level in an ordinary read mode by the data-line load circuit at numerals 201, 202, 401 and 402.

According to the prior-art circuit thus far explained, the two control signals of the write enable signals WEa 340 and WEb 341 are required for the write control. The write enable signal WEa 340 must simultaneously turn "on" or "off" the PMOSFETs 401 and 402 which are large in size and provided in sets of two in each column and which total a large number for all the column. Therefore, the load capacitance of the write enable signal WEa 340 is large, and the delay time thereof is not negligible.

The time delay has resulted in the problem that the "on" and "off" controls of the PMOSFETs 401 and 402 slow down.

Besides, the delay of the write enable signal WEa 340 has posed the problem of lengthening a time period for writing the data into the memory cell MC 121 and the recovery time period of the data lines DL 123 and $\overline{DL}$ 122, immediately after the writing. The reason for this therefor is that a time at which the data writing into the memory cell is started, and the recovery start time of the data lines DL 123 and $\overline{DL}$ 122, immediately after the writing, are determined by a slower one of the write enable signals WEa 340 and WEb 341. Incidentally, the longer recovery time period of the data lines DL 123 and $\overline{DL}$ 122 also extends a read time period at the next timing which immediately succeeds the writing of the data into the memory cell.

Further, the delay of the write enable signal WEa 340 incurs the timing deviation thereof relative to the write enable signal WEb 341. This has led to the problem that, in the case of writing the data items, the conflict between the PMOSFETs 401, 402 and the write drivers 406, 407 is brought about, so through currents flow from the data-line load circuit to the write drivers.

Incidentally, reference materials relevant to memory-cell peripheral circuits in semiconductor memories are "1988, IEEE INTERNATIONAL SOLID-STATE CIRCUITS CONFERENCE, DIGEST OF TECHNICAL PAPERS", PP186–187, and "IEEE 1991, CUSTOM INTEGRATED CIRCUITS CONFERENCE", PP10.4.1–10.4.4.

Meanwhile, the memory cells, as stated above, are stated above are generally included in RAMs. In the RAM, the memory cells are arranged in the shape of a matrix, and data is read out from or written into the memory cell designated by an input address.

There has also been known a semiconductor memory in which a memory cell from which data is to be read out is not designated by an input address, but that a coincidence between search data, afforded as an input, and a stored content, as predetermined data is examined, and the memory cell is designated by the examined result so as to read out the data from a RAM.

Such a semiconductor memory is called a "CAM (Content Addressable Memory)". The semiconductor memory of this type includes separately from the RAM for storing data to-be-read-out, a CAM cell array which is configured of memory cells for storing contents for a coincidence search, as well as coincidence search circuits for detecting the coincidence between the search data and the stored contents of the memory cells.

A known circuit arrangement of such a CAM cell array is disclosed in the official gazette of Japanese Patent Application Laid-open No. 119096/1988.

This circuit arrangement includes a coincidence detection circuit and a voltage/current conversion circuit which are disposed for every group consisting of a plurality of memory cells for storing the same bits of stored data items. It realizes the coincidence search between search data and stored data in the following way: One memory cell corresponding to a word designated by a word line is selected from among the plurality of memory cells, the bit value of the selected memory cell is read out and has its coincidence detected with the value of the same bit of the search data, and the result of the detection is converted into current. Such currents of all the bits of the data are subjected to an OR operation.

In this regard, the coincidences between the search data and all the stored data items need to be detected in CAMs which are applied to a full associative cache memory, etc. Since, however, the prior-art circuit arrangement is furnished with one coincidence detection circuit in correspondence with the plurality of memory cells, it must compare the bit values of the search data and all the stored data items successively while changing over the memory cells through the word lines, in order to detect the coincidences thereof. This has been a significant drawback in terms of the speed of the coincidence detections.

It is therefore considered to furnish each memory cell with the coincidence detection circuit and the voltage/current conversion circuit for the purpose of realizing the coincidence detections between the search data and all the stored data items through one time of operation.

Since, however, the prior-art circuit arrangement operates to read out the data from each memory cell and to detect the coincidence however, the data read out from the memory cell is of small voltage. In order to derive a predetermined current from the voltage, therefore, bipolar transistors of large-sized MOSFETs must be employed for the voltage/current conversion circuit. In view of an increase in a circuit area, accordingly, it is not practical to furnish each memory cell with the voltage/current conversion circuit.

Another known circuit arrangement of the CAM cell array type in the prior art, is disclosed in "IEEE, 1989, CUSTOM INTEGRATED CIRCUITS CONFERENCE", PP10.2.1–10.2.5.

This circuit arrangement is outlined in FIG. 14.

Referring to FIG. 14, the circuit arrangement includes data lines DL 1010 and $\overline{DL}$ 1011, a word line WL 1012, a PMOSFET 4001 for precharging a match line ML 4300, and an inverter circuit 4200 for waveshaping and for driving a load. Symbol CK 4400 denotes a clock signal.

A memory cell 1100 is configured of a flip-flop which is constituted by inverter circuits 1103 and 1104, and NMOSFETs 1101 and 1102 which are turned "on" in the read and write modes of the memory cell. A coincidence search circuit 4100 is configured of NMOSFETs 4101, 4102, 4103 and 4104. Numeral 4105 indicates the ground potential of the circuitry.

A CAM cell 5200 is constructed of the memory cell 1100 and the search circuit 4100.

In the time period of the low level of the clock signal CK 4400, the match line ML 4300 is precharged to the high level by the PMOSFET 4001.

On the other hand, in the time period of the high level of the clock signal CK 4400, whether the potential of the match line is to maintain the high level or to fall to the low level is determined depending upon the result of the comparison between search data and the stored data of the memory cell.

That is, the potential of the match line ML 4300 maintains the high level on condition that the stored data of the memory cell 1100 and the search data, namely, the data items of the data lines DL 1010 and $\overline{DL}$ 1011 are coincident, whereas it falls to the low level on condition that they are noncoincident.

This type of circuit arrangement, however, does not take into consideration that, as a bit width to be simultaneously searched broadens more, the load of the match line ML 4300 for delivering the searched result as an output becomes heavier.

More specifically, the match line ML 4300 is fully swung from the level of a supply voltage to the level of the ground potential. Therefore, in the case where the match line ML 4300 is heavily loaded, a long time is expended in charging/discharging it. This has posed a problem in point of the operating speed of the CAM.

Herein, in order to quickly charge/discharge the match line ML 4300, the PMOSFET 4001 and the MOSFETs constituting the coincidence search circuit 4100, as shown in FIG. 14, must have their gate widths enlarged. This expedient, however, increases the load of the match line still more. Eventually, there has been the problem that the high operating speed and the high integration density of the semiconductor memory are not compatible.

Incidentally, a CAM cell array is also disclosed in "IEEE, 1991, CUSTOM INTEGRATED CIRCUITS CONFERENCE", PP10.2.1–10.2.4.

SUMMARY OF THE INVENTION

As stated above, the prior-art circuit arrangements have been shown to have drawbacks, such as, from the standpoint of raising the operating speeds of the semiconductor memories.

Therefore, the present invention has as one of objectives to raise the operating speed of a semiconductor memory.

In order to accomplish the object, the present invention provides the following semiconductor memories:

The semiconductor memory in one typical aspect of performance of the present invention comprises a memory cell, data lines (e.g., complementary data lines) which are connected to the memory cell when the memory cell is accessed, a drive circuit which drives said data lines in accordance with a value of write data to be written into the memory cell, when the data is written, and transistors which function as bit loads when stored data is read out. The transistors functioning as the bit loads have their ON/OFF states controlled in accordance with the value of the write data in the write mode.

The semiconductor memory in another typical aspect of performance comprises a plurality of memory cells; a plurality of search circuits, each of which is configured of MOSFETs and which is provided in correspondence with said each memory cell, said search circuit including a detection circuit for detecting coincidence between search data afforded as an input and data stored in the corresponding memory cell, and a common-source amplifier for converting a detected result into a current signal and affording it as an output; and an output amplifier by which the current signal from said search circuit is converted into a voltage signal.

With the first-mentioned semiconductor memory according to the present invention, in the write mode, the transistors functioning as the bit loads in the read mood have their ON/OFF states controlled directly by the value of the write data which controls the drive circuit for driving the data lines. Accordingly, no delay arises between the control of the transistors functioning as the bit loads and that of the drive circuit.

Besides, with the second-mentioned semiconductor memory according to the present invention, the detection circuit can detect the relationship between the search data and the stored data of the memory cell at sufficient voltage magnitude and drives the common-source amplifier which is able to be constructed small in size. In this way, according to the semiconductor memory of the present invention, the satisfactory current signal can be produced by the small-sized common-source amplifier. Moreover, since the search result is the current signal, an operating speed can be raised even in case of a heavy load (being capacitive).

BRIEF DESCRIPTION OF THE DRAWINGS

FIG. 15 is a block diagram showing the whole arrangement of a CAM according to the fifth embodiment of the present invention.

DETAILED DESCRIPTION OF THE PREFERRED EMBODIMENTS

Embodiments of a semiconductor memory according to the present invention will be described below.

To begin with, embodiments of a memory-cell peripheral circuit according to the present invention will be explained.

Figure 4:
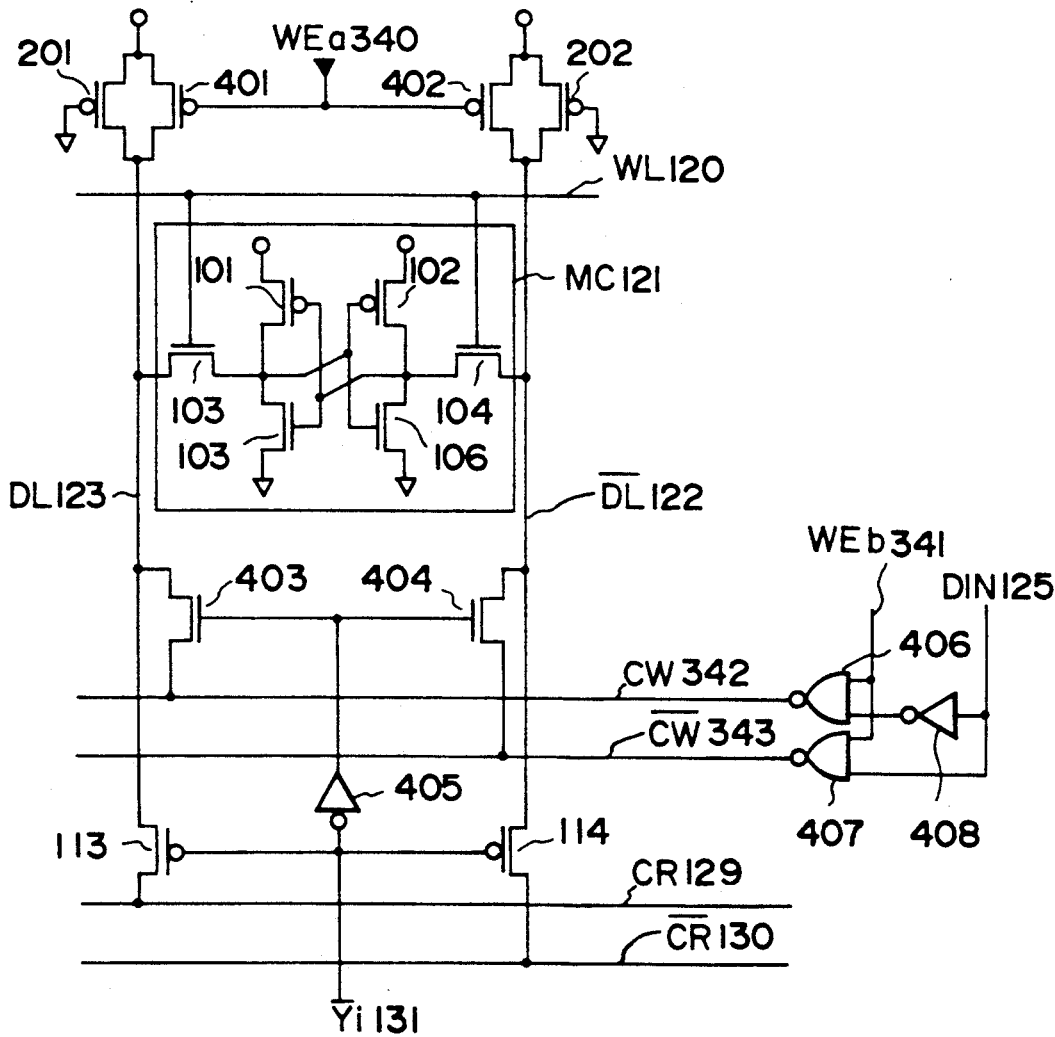
FIG. 4 is a circuit diagram showing the arrangement of a memory peripheral circuit in the prior art.

For the sake of convenience, a memory cell for use in a RAM will be taken as an example in correspondence with the prior-art circuit arrangement stated before (refer to FIG. 4).

Now, the first embodiment of the memory-cell peripheral circuit according to the present invention will be described.

Figure 1:
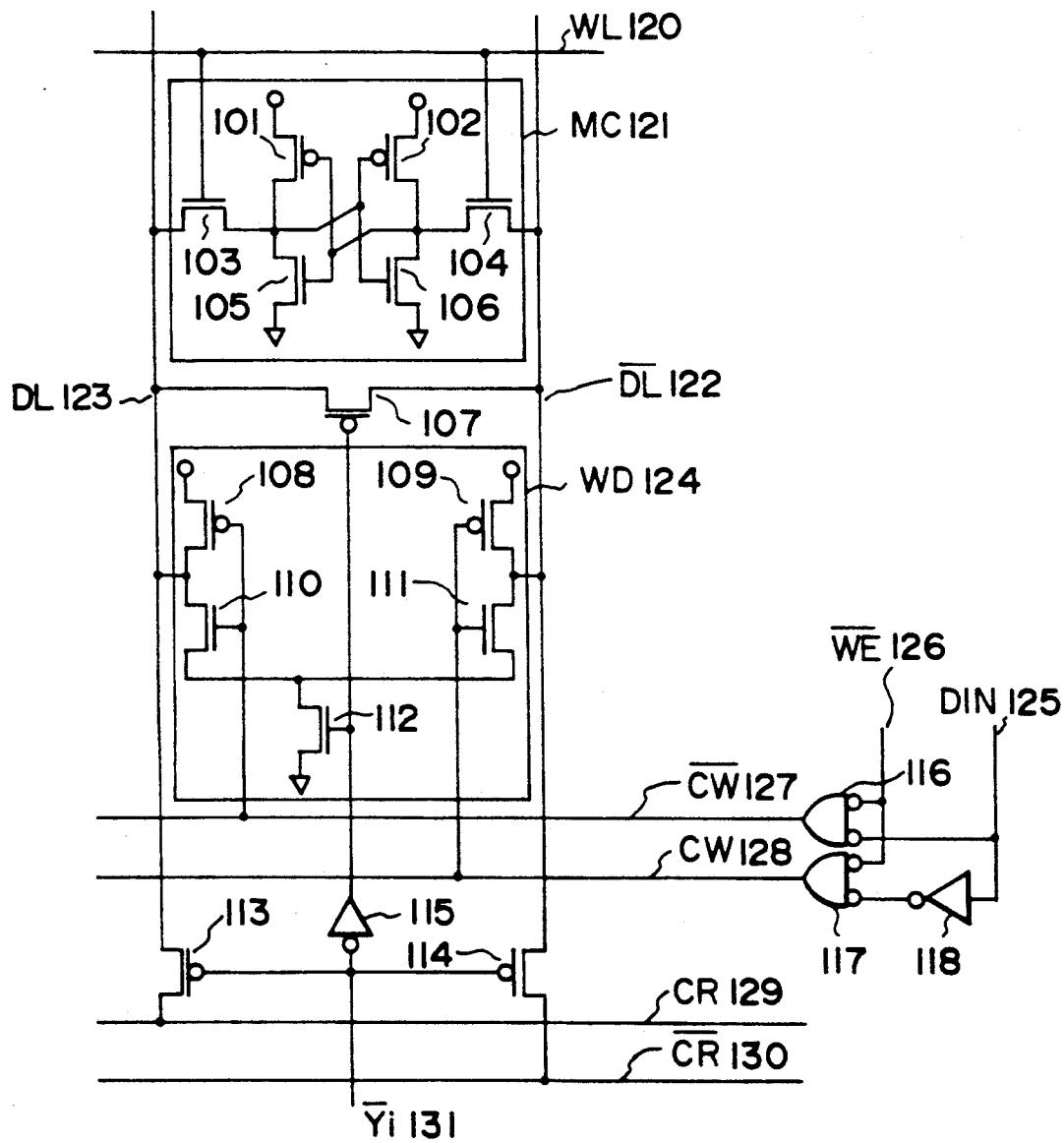
FIG. 1 is a circuit diagram showing the arrangement of a memory peripheral circuit according to the first embodiment of the present invention.

FIG. 1 shows the arrangement of the memory-cell peripheral circuit in the first embodiment.

Referring to the figure, symbol WL 120 denotes a word line. A memory cell MC 121 is configured of PMOSFETs 101 and 102, and NMOSFETs 103, 104, 105 and 106. Symbols DL 123 and $\overline{DL}$ 122 indicate a pair of data lines (or pair of complementary data lines) across which a PMOSFET 107 is connected. A write driver WD 124 is configured of PMOSFETs 108 and 109, and NMOSFETs 110, 111 and 112. The PMOSFETs 108 and 109, included in the write driver WD 124, function as bit loads in a read mode.

Reading column switches 113 and 114 serve to transfer the data items of the data lines DL 123 and $\overline{DL}$ 122 to common read lines CR 129 and $\overline{CR}$ 130, respectively. Shown at numeral 115 is an inverter circuit. A column select signal $\overline{Yi}$ 131 is applied to the gates of the reading column switches 113 and 114. In addition, the column select signal $\overline{Yi}$ 131 is inverted by the inverter circuit 115, and the resulting signal is supplied to the gate of the PMOSFET 107 and the gate of the NMOSFET 112 in the write driver WD 124.

Symbol $\overline{WE}$ 126 denotes a write enable signal, which designates a write state in terms of a "low" level. Write data DIN 125 is directly applied to a write control circuit 116, and is applied to a write control circuit 117 through an inverter circuit 118 for inverting this data. Common write lines CW 128 and $\overline{CW}$ 127 afford input signals to the write driver WD 124 which is disposed at every column.

The memory-cell peripheral circuit of this embodiment operates as described below.

Now, let's consider a case where the write data DIN 125 is written into the memory cell MC 121.

In this case, the word line WL 120 is set at a "high" level, thereby to bring the memory cell MC 121 into a selected state. Besides, the column select signal $\overline{Yi}$ 131 is set at the low level, thereby to turn "on" the reading column switches 113, 114 and the NMOSFET 112 in the write driver WD 124 and to turn "off" the PMOSFET 107.

Subsequently, the write enable signal % WE 126 is changed from the high level to the low level. Thus, the data items of the common write lines are written into the memory cell.

More specifically, when the write enable signal WE 126 has been changed from the high level to the low level the signal of either of the common write lines CW 128 and $\overline{CW}$ 127 is changed from the low level to the high level by the write control circuits 116 and 117.

It is now assumed that the write data DIN 125 is at the low level, so the line $\overline{CW}$ 127 has changed to the high level. Then, owing to the line CW 128 maintained at the low level, the PMOSFET 109 maintains the "on" state, and the NMOSFET 111 holds the "off" state. Accordingly, the data line $\overline{DL}$ 122 holds the high level.

On the other hand, the NMOSFET 110 is changed into the "on" state by the line $\overline{CW}$ 127 of the high level. Consequently, the data line DL 123 is drawn to the low level through this NMOSFET 110 and the NMOSFET 112 controlled into the "on" state by the column select signal $\overline{Yi}$ 131 of the low level. On this occasion, the data line DL 123 is set to the low level because the PMOSFET 108 is changed into the "off" state by the line $\overline{CW}$ 127 of the high level.

In this manner, the data items of the common write lines CW 128, $\overline{CW}$ 127 are input to the write driver WD 124 and are written into the memory cell MC 121 through the data lines DL 123, $\overline{DL}$ 122. In a case where the write data DIN 125 is at the high level, the high level and low level are respectively transferred to the data lines DL 123 and $\overline{DL}$ 122 opposite that of to the above, and they are written into the memory cell MC 121.

Here, let it be supposed that the column select signal % Yi 131 is at the high level. The output of the inverter circuit 115 becomes the low level, to turn "off" the NMOSFET 112 included in the write driver WD 124. In this case, accordingly, no data is transferred to the data lines DL 123, $\overline{DL}$ 122.

The data writting mode is ended by changing the write enable signal $\overline{WE}$ 126 from the low level to the high level. When the writting has ended, both the common write lines CW 128 and $\overline{CW}$ 127 become the low level. Accordingly, the potential of the data line DL 123 or $\overline{DL}$ 122 having fallen to the low level for the writing is recovered to a data-line voltage in the read mode by the PMOSFET 109 or 108 included in the write driver WD 124.

By the way, the PMOSFET 107 serves to equalize the data lines DL 123 and $\overline{DL}$ 122 of a non-selected column. More specifically, in the write mode, either the PMOSFET 108 or the PMOSFET 109 falls into the "off" state in one of the columns. Besides, the NMOSFET 112 falls into the "off" state in the column which is not selected by the column select signal $\overline{Yi}$ 131. In the non-selected column, accordingly, either of the data lines DL 123 and $\overline{DL}$ 122 can be connected to any memory cell selected by the word line WL 120, to lower its potential due to a memory cell current flowing between it and the memory cell.

Therefore, when the column select signal $\overline{Yi}$ 131 is at the high level, the PMOSFET 107 turns "on" to connect the data lines DL 123 and $\overline{DL}$ 122. Thus, as regards the column which is not selected by the column select signal $\overline{Yi}$ 131, the potential of the data line DL 123 or $\overline{DL}$ 122 is prevented from lowering due to the memory cell current or a leakage current.

According to the first embodiment described above, both the writing of the data items into the memory cell and the control of the pull-up of the data line after the writing are effected by the write driver WD 124.

Accordingly, the embodiment can prevent the conflict between the data-line load circuit and the write driver unlike the prior-art circuit arrangement in FIG. 4, with the result that it can shorten the period of time for writing the data into the memory cell and the recovery time period of the data line after the writing. Moreover, it can prevent a through current which is ascribable to the simultaneous turn-on operations of the data-line load circuit and the write driver.

Next, the second embodiment of the memory-cell peripheral circuit will be described.

Figure 2:
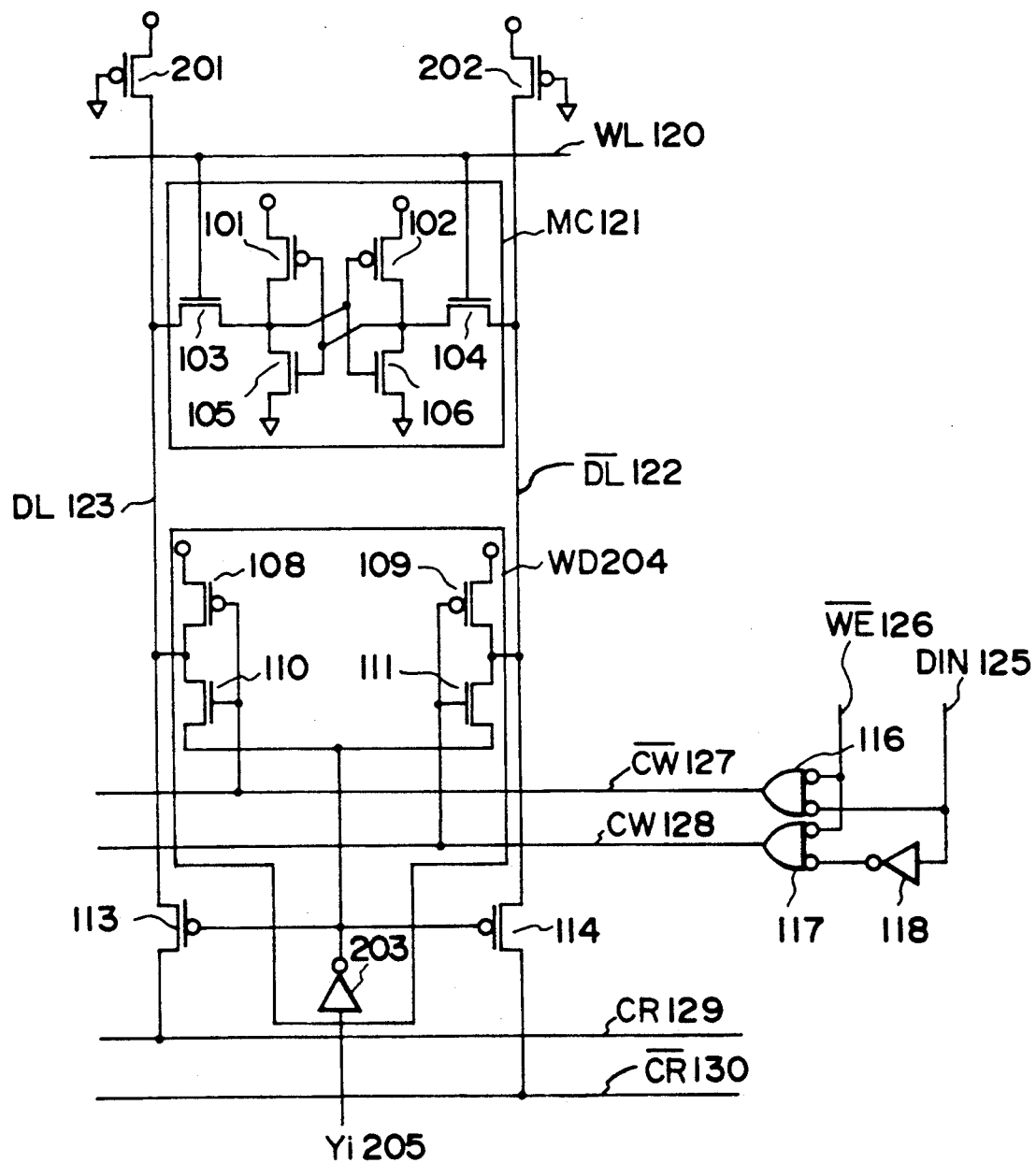
FIG. 2 is a circuit diagram showing the arrangement of a memory peripheral circuit according to the second embodiment of the present invention.

FIG. 2 shows the arrangement of the memory peripheral circuit according to the second embodiment.

Referring to the figure, numerals 201 and 202 indicate PMOSFETs of low driving ability, which pull up respective data lines DL 123 and $\overline{DL}$ 122. An inverter circuit 203 operates to invert a column select signal Yi 205, and it is included in a write driver WD 204. Here, PMOSFETs 108 and 109 included in the write driver WD 204, and the PMOSFETs 201 and 202 mentioned above operate as data-line loads.

In FIG. 2, the same constituents as in the memory cell peripheral circuit of the first embodiment (in FIG. 1) have the same symbols assigned thereto and therefore, description thereof is unnecessary and will be omitted.

The memory-cell peripheral circuit of this embodiment operates as described below.

The mode of writing the input data DIN 125 into the memory cell MC 121 is controlled substantially similarly to that of the first embodiment. In the second embodiment, however, the data items are written on condition that the output of the inverter circuit 203 has become the low level with the column select signal Yi 205 set at the high level.

When the write enable signal $\overline{CW}$ 126 has been changed from the high level to the low level, the signal of either of the common write lines CW 128 and $\overline{CW}$ 127 is changed from the low level to the high level by the write control circuits 116 and 117.

It is now assumed that the write data DIN 125 is at the low level, so the line $\overline{CW}$ 127 has changed to the high level. Then, owing to the line CW 128 maintained at the low level, the PMOSFET 109 maintains the "on" state, and the NMOSFET 111 holds the "off" state. Accordingly, the data line $\overline{DL}$ 122 holds the high level.

On the other hand, the NMOSFET 110 is changed into the "on" state by the line $\overline{CW}$ 127 of the high level, so that the data line DL 123 is set to the low level which corresponds to the output level of the inverter circuit 203 through this NMOSFET 110. On this occasion, the data line DL 123 is easily changed to the low level because the PMOSFET 108 is switched into the "off" state by the line $\overline{CW}$ 127 which is at the high level.

In this manner, the data items of the common write lines CW 128, $\overline{CW}$ 127 are input to the write driver WD 204 and are written into the memory cell MC 121 through the data lines DL 123, $\overline{DL}$ 122. In a case where the write data DIN 125 is at the high level, the high level and low level are respectively transferred to the data lines DL 123 and $\overline{DL}$ 122 opposite that of the above, and they are written into the memory cell MC 121.

The data writing mode is ended by changing the write enable signal $\overline{WE}$ 126 from the low level to the high level. When the writing mode has ended, both the common write lines CW 128 and $\overline{CW}$ 127 become the low level. Accordingly, the potential of the data line DL 123 or $\overline{DL}$ 122 having fallen to the low level for the writing is recovered to a voltage in the read mode by the PMOSFET 109 or 108 included in the write driver WD 124.

By the way, the PMOSFETs 201 and 202 prevent the potentials of the data lines DL 123 and $\overline{DL}$ 122 from lowering due to the memory cell currents as regards the column which is not selected in the write mode.

According to the second embodiment, the inverter circuit employed for the inversion of the column select signal in the first embodiment can be also used as part of the write driver WD 204. In consequence, the circuit for writing or reading control which includes the column selecting circuit can be realized by a smaller number of circuit elements.

Now, the third embodiment of the memory-cell peripheral circuit will be described.

Figure 3:
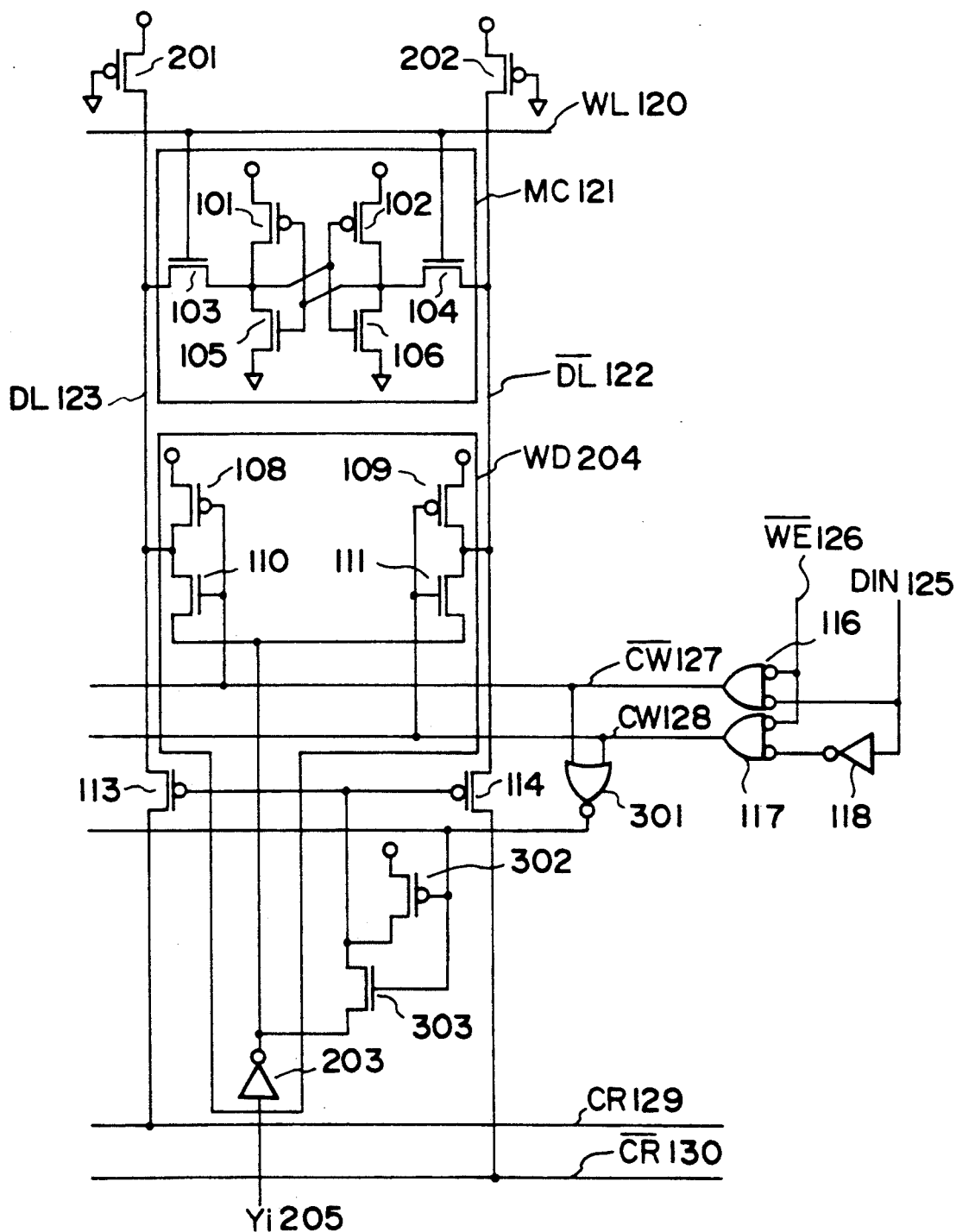
FIG. 3 is a circuit diagram showing the arrangement of a memory peripheral circuit according to the third embodiment of the present invention.

FIG. 3 shows the arrangement of the memory-cell peripheral circuit according to the third embodiment.

Referring to the figure, numeral 301 indicates a write-mode detection circuit which detects the fact that the signal of either of common write lines CW 128 and $\overline{CW}$ 127 has become the high level.

A PMOSFET 302 and an NMOSEFT 303 constitute a control circuit which controls column switches 113 and 114 for reading, and which operates upon receiving the output signal of the write-mode detection circuit 301.

In FIG. 3, the same constituents as in the memory cell peripheral circuit of the second embodiment (in FIG. 2) have the same symbols assigned thereto, and therefore, description thereof shall be omitted from the description of the present embodiment.

The memory-cell peripheral circuit of this embodiment operates as described below.

The write operation of the memory cell peripheral circuit in the third embodiment is the same as that in the second embodiment except the following:

In the third embodiment, the reading column switches 113 and 114 are forcibly turned "off" in the write mode. Incidentally, they are controlled by the output signal of the inverter circuit 203 in the read mode.

Thus, the fall of the potential of the data line DL 123 or $\overline{DL}$ 122 having occurred in the write mode can be prevented from propagating to the common read line CR 129 or $\overline{CR}$ 130.

As described above, according to the third embodiment, the reading column switches 113 and 114 can be controlled by the write-mode detection circuit 301 which is disposed in correspondence with the pair of common write lines CW 128 and %CW 127. That is, merely by providing the write enable signal $\overline{WE}$ 126 common to the whole memory circuit and the write-mode detection circuits 301 for the respective pairs of common write lines CW 128 and $\overline{CW}$ 127, the fall of a potential of one of the data lines DL 123 or %DL 122 occurring in the write mode, can be prevented from propagating to the common read lines CR 129 or %CR 130, in the whole memory circuit.

According to each of the foregoing embodiments, the write control can be performed with one kind of write enable signal which is common to the whole memory circuit.

Consequently, the arrangement of the control circuit for writing data can be simplified. In addition, a total load capacitance which the write enable signal drives becomes smaller than in the prior art. Also, regarding the common write lines CW 128 and $\overline{CW}$ 127, loads become lighter than in the prior art for the following reason: With the prior-art circuit arrangement (refer to FIG. 4), the common write lines CW 342 and $\overline{CW}$ 343 must drive the data lines DL 123 and $\overline{DL}$ 122 of large load capacitance through the NMOSFETs 403 and 404, respectively. In contrast, according to the embodiment, the common write lines CW 128 and %CW 127 are merely used to drive the PMOSFETs 108, 109 and the NMOSFETs 110, 111 in order to write the data.

Accordingly, the writing time period and the recovery time period can be shortened. Moreover, since the write driver and the data-line load circuit can be controlled by the same signal, the through current ascribable to the deviation between the write timing and the data-line recovery timing can be prevented.

By the way, each of the foregoing embodiments has been described as to the case where the memory cell to be accessed is selected using the word select signal WL 120 and the column select signal Yi 205. However, in a case where the memory cell to be accessed is selected using only the word select signal WL 120, the MOSFETs and the inverter circuit which are relevant to the column select signal Yi 205 may well be omitted in each of the embodiments, thereby to directly connect the constituents so as to establish the same state as the state which is assumed when the column select signal Yi 205 is high.

Now, the fourth embodiment of the semiconductor memory according to the present invention will be described.

The fourth embodiment concerns a CAM.

Figure 5:
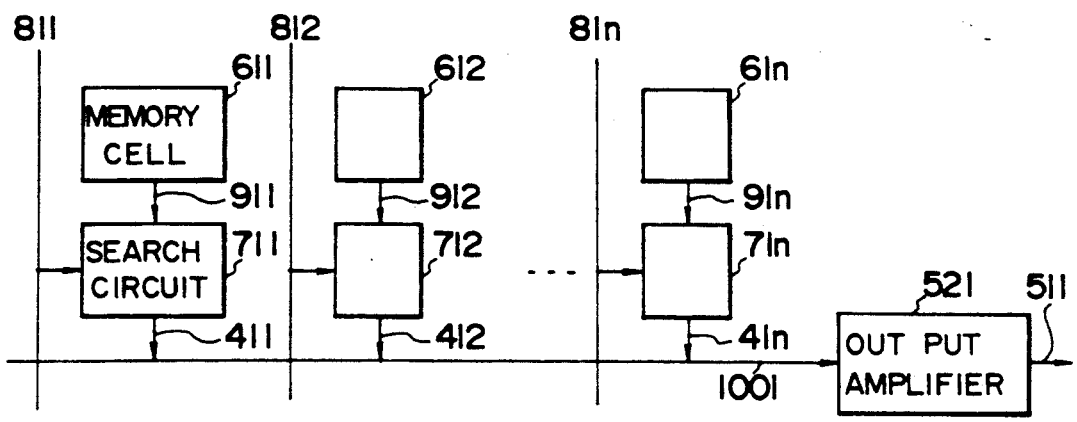
FIG. 5 is a block diagram showing the first basic arrangement of a CAM cell array according to the fourth embodiment of the present invention.

First, FIG. 5 shows the basic arrangement of that CAM cell array of the CAM which takes charge of storing data items to be examined as to their coincidences with search data items and examining the coincidences.

Referring to the figure, symbols 811, 812, ... and 81n denote search data items, symbols 611, 612, ... and 61n memory cells, and symbols 911, 912, ... and 91n data items stored in the memory cells. Symbols 711, 712, ... and 71n denote search circuits which compare the stored data items 911, 912, ... and 91n of the memory cells and the search data items 811, 812, ... and 81n to make a search, respectively.

Search output signals 411, 412, ... and 41n are current signals delivered as compared results by the search circuits.

Shown at numeral 1001 is a match line on which the search output signals 411, 412, ... and 41n of the respective search circuits 711, 712, ... and 71n are subjected to wired OR.

An output amplifier 521 receives the current signals of the match line 1001, and converts them into a voltage signal.

The voltage signal thus produced is indicated as a match output signal 511.

The match line 1001 has its potential clamped by the output amplifier 521.

Besides, the match line 1001 bears a heavy load because the search circuits 711, 712, ... and 71n are connected thereto.

The search data items 811, 812, ... and 81n are respectively compared for the search with the stored data items 911, 912, ... and 91n of the memory cells by the search circuits 711, 712, ... and 71n.

In a case where the comparisons for the search have resulted in satisfying a certain condition, the search output signals 411, 412, ... and 41n are produced as the current signals. These search output signals 411, 412, ... and 41n left intact as the current signals are subjected to the wired OR by the match line 1001, and are converted into the voltage signal by the output amplifier 521. Owing to the current operation, the match line 1001 operates at high speed in spite of the heavy load.

Accordingly, the match output signal 511 can be obtained shortly after inputting the search data.

Figure 6:
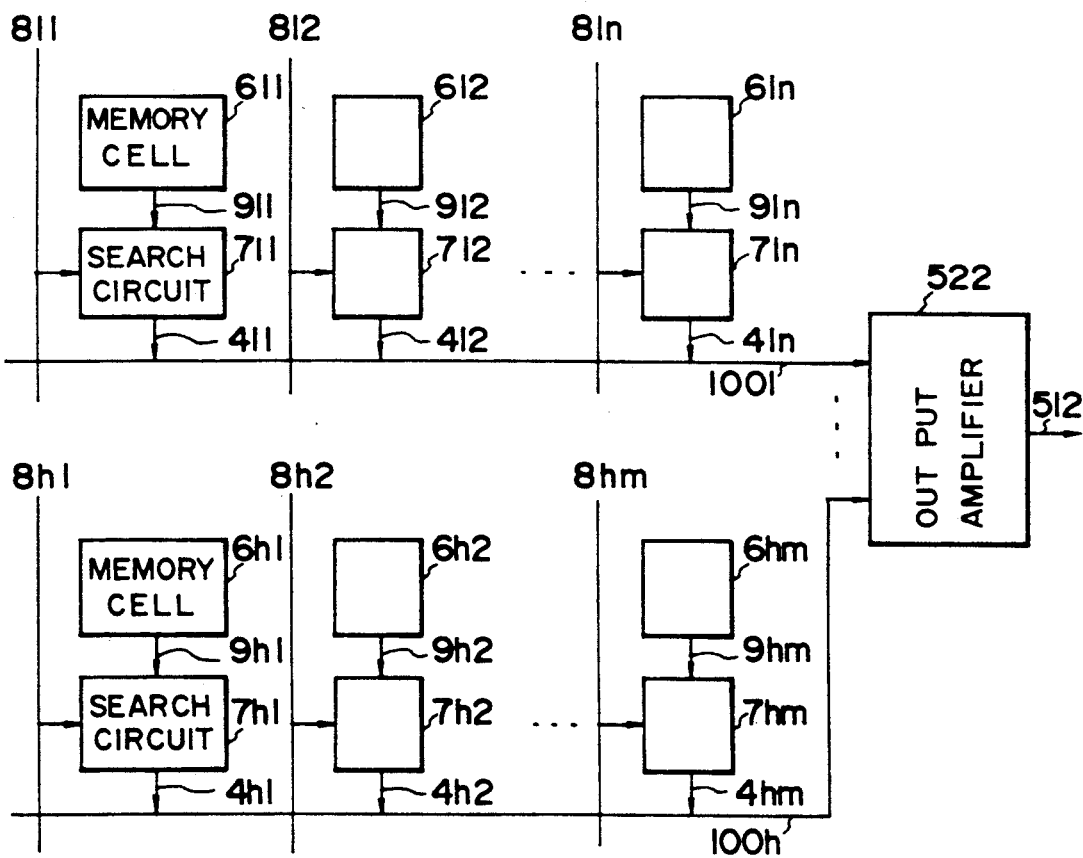
FIG. 6 is a block diagram showing the second basic arrangement of the CAM cell array according to the fourth embodiment of the present invention.

FIG. 6 shows the basic arrangement of a CAM cell array in the case where the match line is divided in h and where the resultant match lines are connected to a multi-input output amplifier.

In FIG. 6, the same parts as in FIG. 5 are denoted by the same symbols.

Symbols 8h1, 8h2, ... and 8hm denote search data items, symbols 6h1, 6h2, ... and 6hm memory cells, and symbols 9h1, 9h2, ... and 9hm data items stored in the memory cells. Symbols 7h1, 7h2, ... and 7hm denote search circuits which compare the stored data items 9h1, 9h2, ... and 9hm of the memory cells and the search data items 8h1, 8h2, ... and 8hm to make a search, respectively.

Search output signals 4h1, 4h2, ... and 4hm are current signals delivered as compared results by the search circuits.

Shown at symbol 100h is a match line on which the search output signals 4h1, 4h2, ... and 4hm of the respective search circuits 7h1, 7h2, ... and 7hm are subjected to wired OR.

A multi-input output amplifier 522 receives the current signals subjected to the wired ORs by the match lines 1001-100h, and converts them into a voltage signal.

The voltage signal thus produced is indicated as a match output signal 51 2.

Owing to the arrangement as shown in FIG. 5 or FIG. 6, the potential of each match line heavily loaded by the connection of the large number of search circuits can be clamped. That is, the potential of each match line under the heavy load is suppressed to be low, and the match signal based on a current change is utilized, whereby the period of time expended since the input of the search data till the provision of the match output signal (searched result output) can be shortened.

Figure 7:
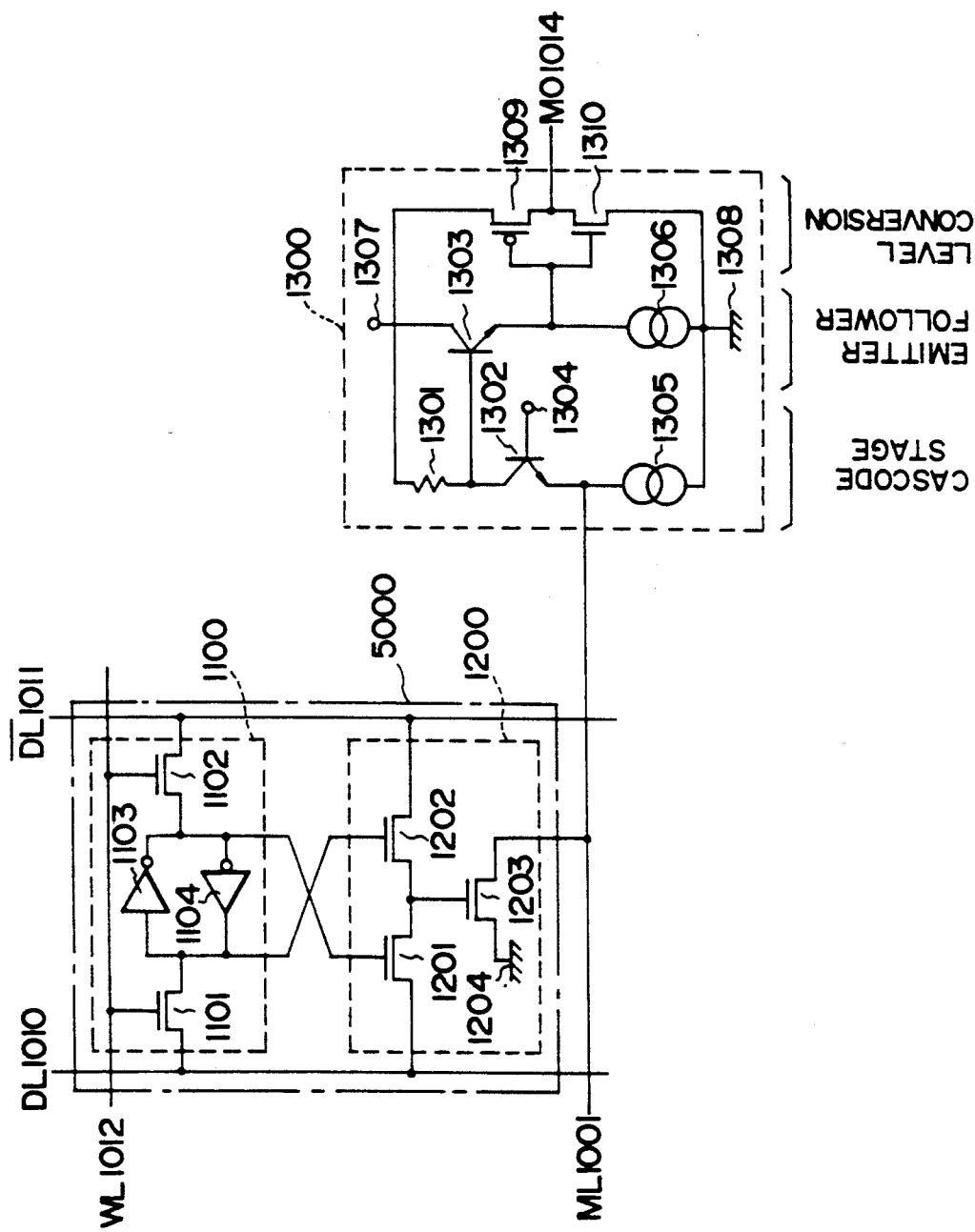
FIG. 7 is a circuit diagram showing the first exemplary arrangement of a search circuit as well as an output amplifier according to the fourth embodiment of the present invention.

FIG. 7 shows the detailed arrangements of the memory cell 611, search circuit 711 and output amplifier 521 extracted from FIG. 5.

Referring to FIG. 7, symbols DL 1010 and $\overline{DL}$ 1011 denote data lines for reading and writing data from and into a memory cell and also for inputting search data. Symbol WL 1012 indicates a word line.

The memory cell 1100 is configured of a flip-flop which is constituted by inverter circuits 1103 and 1104, and NMOSFETs 1 101 and 1102 which are turned "on" in the read and write modes of the memory cell.

A coincidence search circuit 1200 is configured of NMOSFETs 1201, 1202 and 1203.

Numeral 1204 indicates the ground potential of the circuitry. A CAM cell 5000 is constructed of the memory cell 1100 and the search circuit 1200.

Symbol ML 1001 denotes a match line, on which results obtained by comparing the search data items DL 1010, $\overline{DL}$ 1011 and the stored data items of the memory cells for the respective CAM cells 5000 are subjected to wired OR. Shown at numeral 1300 is an output amplifier.

The output amplifier 1300 includes a resistor 1301, and a bipolar transistor 1302 whose emitter is connected to the match line ML 1001.

Further, it includes a bipolar transistor 1303 for an emitter follower, regulated current sources 1305 and 1306, and a PMOSFET 1309 and an NMOSFET 1310 which constitute a level conversion circuit based on a CMOS inverter. Numeral 1304 represents a reference potential, numeral 1307 a power source potential, and numeral 1308 the ground potential. Symbol MO 1014 denotes a match output signal.

The semiconductor memory shown in FIG. 7 operates as described below.

The operation of writing the data into the memory cell 1100 is performed in a state in which the word line WL 1012 is at the high level.

The write data items afforded as inputs from the data lines DL 1010 and $\overline{DL}$ 1011 are stored in the flip-flop constituted by the inverter circuits 1 103 and 1 104, through the respective NMOSFETs 1 101 and 1102.

The operation of reading the data out of the memory cell 1100 is performed in the state in which the word line WL 101 2 is at the high level. The stored data items of the flip-flop constituted by the inverter circuits 1103 and 1104 are afforded as outputs to the data lines DL 1010 and $\overline{DL}$ 1011 through the respective NMOSFETs 1 101 and 1102.

Next, the operation of detecting the coincidence between the search data and the stored data of the memory cell will be described.

The search data items afforded as inputs to the data lines DL 1010 and $\overline{DL}$ 1011 are respectively compared with the stored data items of the memory cell 1 100 by the NMOSFETs 1201 and 1202 of the search circuit 1200. Depending upon the results of the comparisons, the gate of the NMOSFET 1203 becomes the low level in case of the coincidence, and it becomes the high level in case of noncoincidence.

Herein, it is the search data items that are input to the data lines DL 1010, $\overline{DL}$ 1011, and it is the outputs of the inverter circuits 1103, 1104 that drive the respective NMOSFETs 1201, 1202. Therefore, a voltage sufficient for driving the NMOSFET 1203 can be obtained.

Accordingly, MOSFETs of small size suffice for use in the coincidence search circuit 1200, and no problem is posed as to the area of the circuitry even when each memory cell 1100 is furnished with the coincidence search circuit 1200.

In the above way, when the noncoincidence takes place in any of the plurality of CAM cells 5000 connected to the match line ML 1001, current is caused to flow to the match line ML 1001 by the NMOSFET 1203.

In other words, no current flows only in a case where all the CAM cells 5000 connected to the match line ML 1001 are coincident.

The current signal of the match line ML 1001 becomes the collector current of the bipolar transistor 1302, and this current is converted into a voltage signal by the resistor 1301. Therefore, the coincidence detection signal can be output as a voltage signal of (i×R).

The potential of the match line ML 1001 is clamped by the bipolar transistor 1302 whose base is held at the reference potential 1304, so that the potential change of the match line is suppressed on the order of several tens mV.

Thus, the coincidence search can be made at high speed irrespective of the number of the CAM cells 5000 which are connected to the match line ML 1001.

Figure 8:
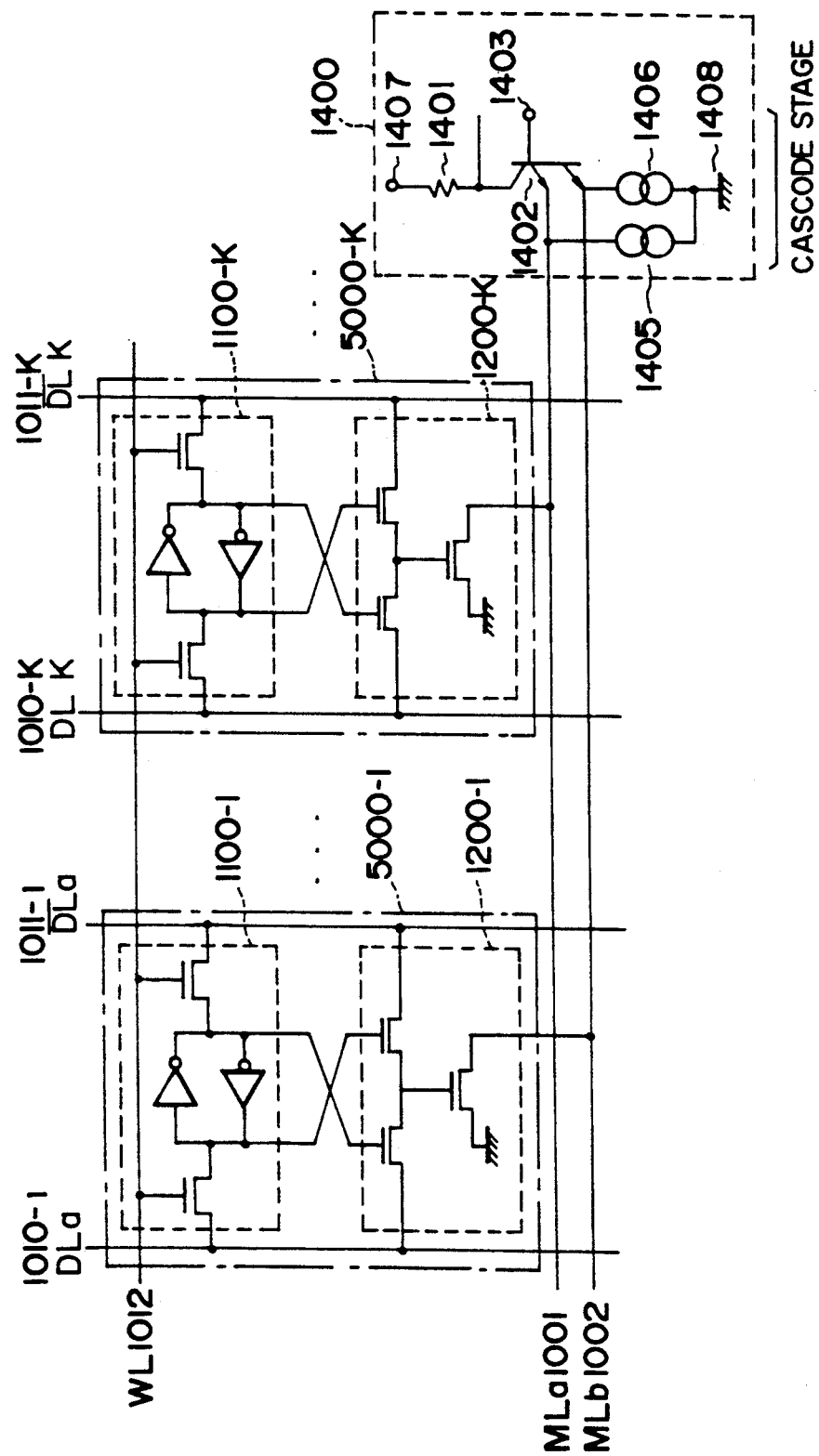
FIG. 8 is a circuit diagram showing the second exemplary arrangement of the search circuit as well as the output amplifier according to the fourth embodiment of the present invention.

FIG. 8 shows the detailed arrangements of the memory cell 611 as well as the search circuit 711, the memory cell 6hl as well as the search circuit 7hl, and the output amplifier 522 extracted from FIG. 6.

For the brevity of the explanation, h=2 is assumed. That is, the illustrated example corresponds to a case where two divisional match lines are laid and where they are connected to the output amplifier having two inputs based on a multiemitter bipolar transistor.

In FIG. 8, the same parts as in FIG. 6 are indicated by the same symbols.

Symbols DLa 1010-1, $\overline{DL}$a 1011-1 and DLk 1010-k, %DLk 1011-k denote differential pairs of data lines; symbols 1101-1 and 1101-k memory cells; symbols 1200-1 and 1 200-k coincidence search circuits; symbols 5000 5000-2 CAM cells; and symbols MLa 1001 and MLb 1002 match lines. The different CAM cells are respectively connected to the match lines MLa 1001 and MLb 1002.

Numeral 1400 indicates an output amplifier which includes a resistor 1401, a multiemitter bipolar transistor 1402, and regulated current sources 1405 and 1406. A reference potential 1403, a power source potential 1407, and the ground potential 1408 of the circuitry are applied to the output amplifier 1400.

In the output amplifier 1400, the emitter follower and the level conversion circuit shown in FIG. 7 referred to before are omitted from illustration.

In the example shown in FIG. 8, the load and current quantity of the match line are distributed in such a way that the coincidence detection results of the CAM cells 5000-1~5000-k connected to a word line WL 1012 are delivered to the two match lines MLa 1001 and MLb 1002.

The two match lines MLa 1001 and MLb 1002 are respectively connected to the corresponding emitters of the multiemitter bipolar transistor 1402 included in the output amplifier 1400. Accordingly, the coincidence search output signals of all the CAM cells 5000-1~5000-k connected to the word line WL 1012 are turned into a voltage signal by the resistor 1401 through the multiemitter bipolar transistor 1402, and the voltage signal is produced as an output.

FIG. 8 referred to above has illustrated the example in which the two divisional match lines are laid and in which the output amplifier includes the multiemitter bipolar transistor of the two inputs. This expedient, however, can be readily expanded into the combination between, e.g., three divisional match lines and a multiemitter bipolar transistor of three inputs, or four divisional match lines and a multiemitter bipolar transistor of four inputs.

Figure 9:
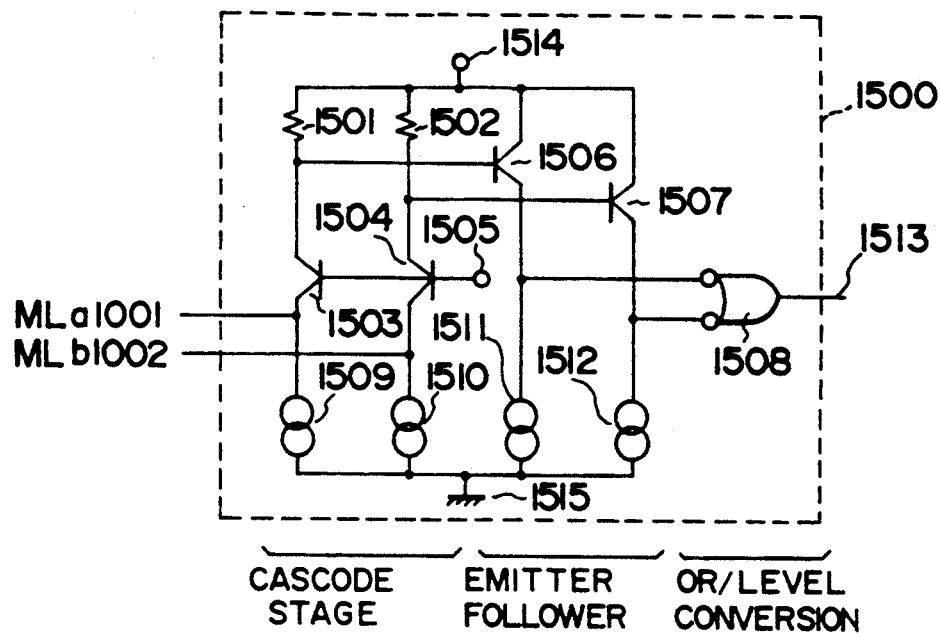
FIG. 9 is a circuit diagram showing the third exemplary arrangement of the output amplifier according to the fourth embodiment of the present invention.
Figure 10:
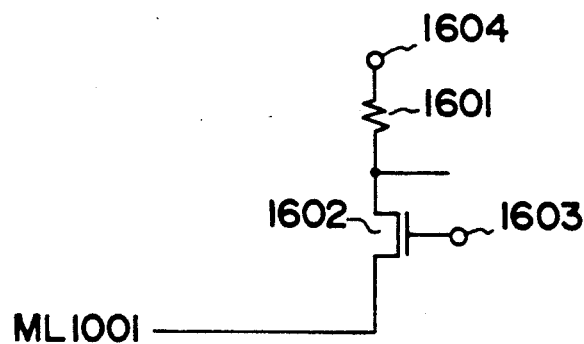
FIG. 10 is a circuit diagram showing the fourth exemplary arrangement of the output amplifier according to the fourth embodiment of the present invention.

Now, two other exemplary arrangements of the output amplifier are shown in FIG. 9 and FIG. 10.

Likewise to the output amplifier 1400 shown in FIG. 8, an output amplifier 1500 shown in FIG. 9 converts inputs from two match lines MLa 1001 and MLb 1002, into one search output signal.

The output amplifier 1500 is configured of resistors 1501 and 1502, bipolar transistors 1503 and 1504 whose emitters have the match lines MLa 1001 and MLb 1002 respectively connected thereto, bipolar transistors 1506 and 1507 for emitter followers, an OR circuit 1508 which fulfills also a level converting function, and regulated current sources 1509, 1510, 1511 and 1512. Numeral 1505 indicates a reference potential, numeral 1513 a search output signal, numeral 1514 a power source potential, and numeral 1515 the ground potential of the circuitry.

This output amplifier 1500 operates as described below.

The current signals of the match lines MLa 1001 and MLb 1002 become the collector currents of the bipolar transistors 1503 and 1504, and these currents are converted into voltage signals by the resistors 1501 and 1502, respectively.

The two resulting voltage signals have their levels shifted by the emitter-follower bipolar transistors 1506 and 1507, respectively. Further, the level-shifted signals have their voltage amplitudes enlarged and are subjected to OR into the single search output signal by the level conversion circuit 1508.

An output amplifier shown in FIG. 10 is constructed having a MOSFET, and it converts an input from a single match line ML 1010 into a search output signal similarly to the output amplifier 1300 shown in FIG. 7.

Referring to FIG. 10, the output amplifier is configured of a resistor 1601, and an NMOSFET 1602 whose gate has a reference potential 1603 applied thereto. Numeral 1604 indicates a power source potential.

In this output amplifier, the current signal of the match line ML 1010 becomes the drain current of the NMOSFET 1602, and this current is converted into a voltage signal by the resistor 1601.

Figure 11:
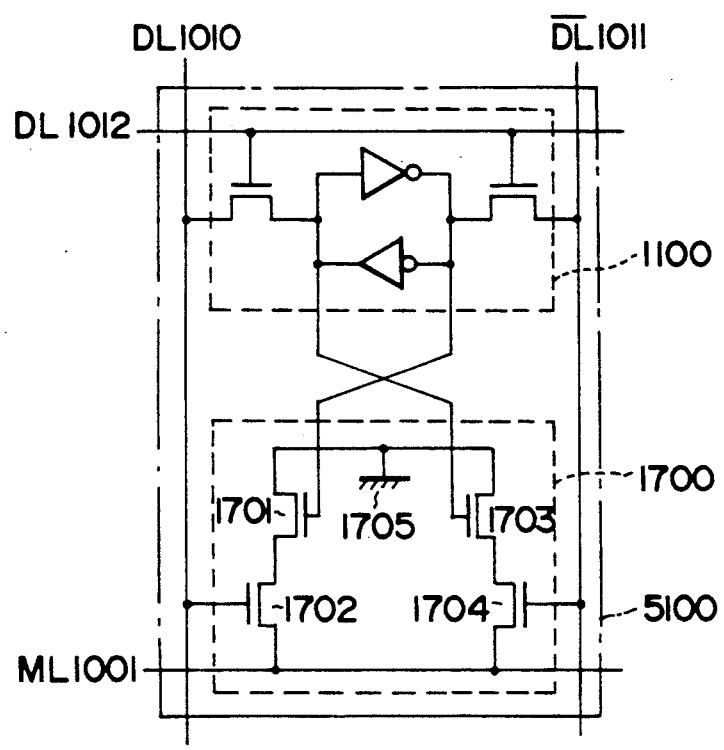
FIG. 11 is a circuit diagram showing the second exemplary arrangement of a CAM cell according to the fourth embodiment of the present invention.

Next, another exemplary arrangement of the CAM cell 5000 shown in FIG. 7 or FIG. 8 is shown in FIG. 11.

The same parts as in FIG. 7 are denoted by the same symbols, and they shall be omitted from description.

Referring to FIG. 11, numeral 1700 indicates a coincidence detection circuit.

The circuit 1700 is configured of NMOSFETs 1701, 1702, 1703 and 1704. Shown at numeral 1705 is the ground potential of the circuitry.

A CAM cell 5100 is constructed of the memory cell 1100 and the coincidence detection circuit 1700.

In a case where search data items afforded to the data lines DL 1010 and $\overline{DL}$ 1011 are not coincident with the stored data items of the memory cell 1100, current flows from the match line ML 1001 to the ground potential 1705. To the contrary, in a case where they are coincident, no current flows from the match line ML 1001 to the ground potential 1705.

Accordingly, an output amplifier can detect the coincidence/noncoincidence between the stored data of the memory cell 1100 and the search data of the data lines DL 1010, % DL 1011 on the basis of the current signal delivered to the match line ML 1001.

Figure 12:
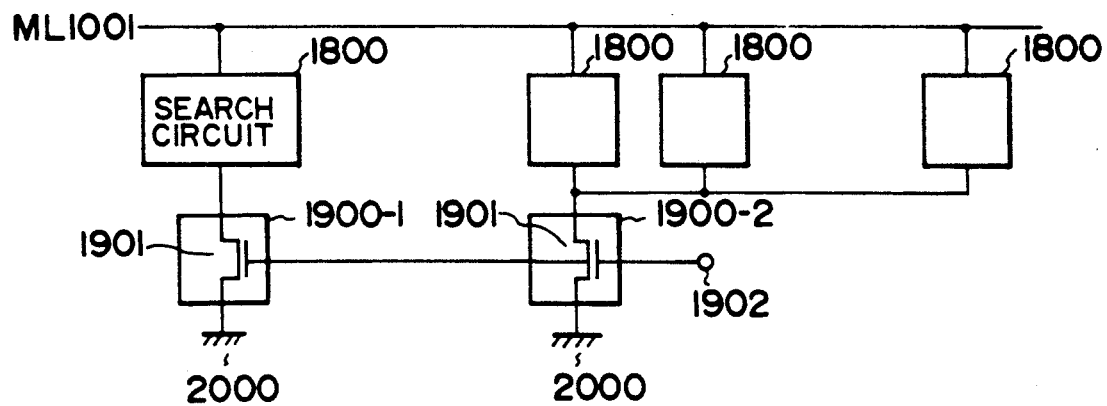
FIG. 12 is a circuit diagram showing another exemplary arrangement of the search circuit according to the fourth embodiment of the present invention.

Next, examples of current limiter circuits provided for the search circuits 41n in FIG. 5 or those 4hm in FIG. 6 are shown in FIG. 12.

FIG. 12 illustrates current paths from a match line ML 1001 to the ground potential 2000 of the circuitry.

In the figure, numeral 1800 indicates each search circuit, numerals 1900-1 and 1900-2 current limiter circuits, numeral 1901 each NMOSFET, and numeral 1902 a reference potential.

The current paths from the match line ML 1001 to the ground potential 2000 are formed by the search circuits 1800 connected to the match line ML 1001.

The current limiter circuits 1900 1 and 1900-2 are inserted in the current paths.

The current limiter circuit 1900-1 is the example in which one current limiter circuit is disposed in correspondence with one search circuit 1800.

On the other hand, the current limiter circuit 1900-2 is the example in which one current limiter circuit is disposed in correspondence with a plurality of search circuits.

By disposing the current limiter circuits in this manner, an unnecessary power consumption ascribable to the dispersion of MOSFETs can be excluded.

More specifically, in the circuit arrangement of FIG. 7 by way of example, the NMOSFET 1203 determines the value of the current which flows to the match line ML 1001. Since, however, a certain manufactural dispersion is inevitably involved in MOSFETs, the minimum current value intended to be guaranteed is infallibly exceeded by any of the NMOSFETs 1203, and an unnecessary current flows to increase consumptive power.

Owing to the current limiter circuit, the unnecessary current can be suppressed to prevent the increased power consumption.

Figure 13:
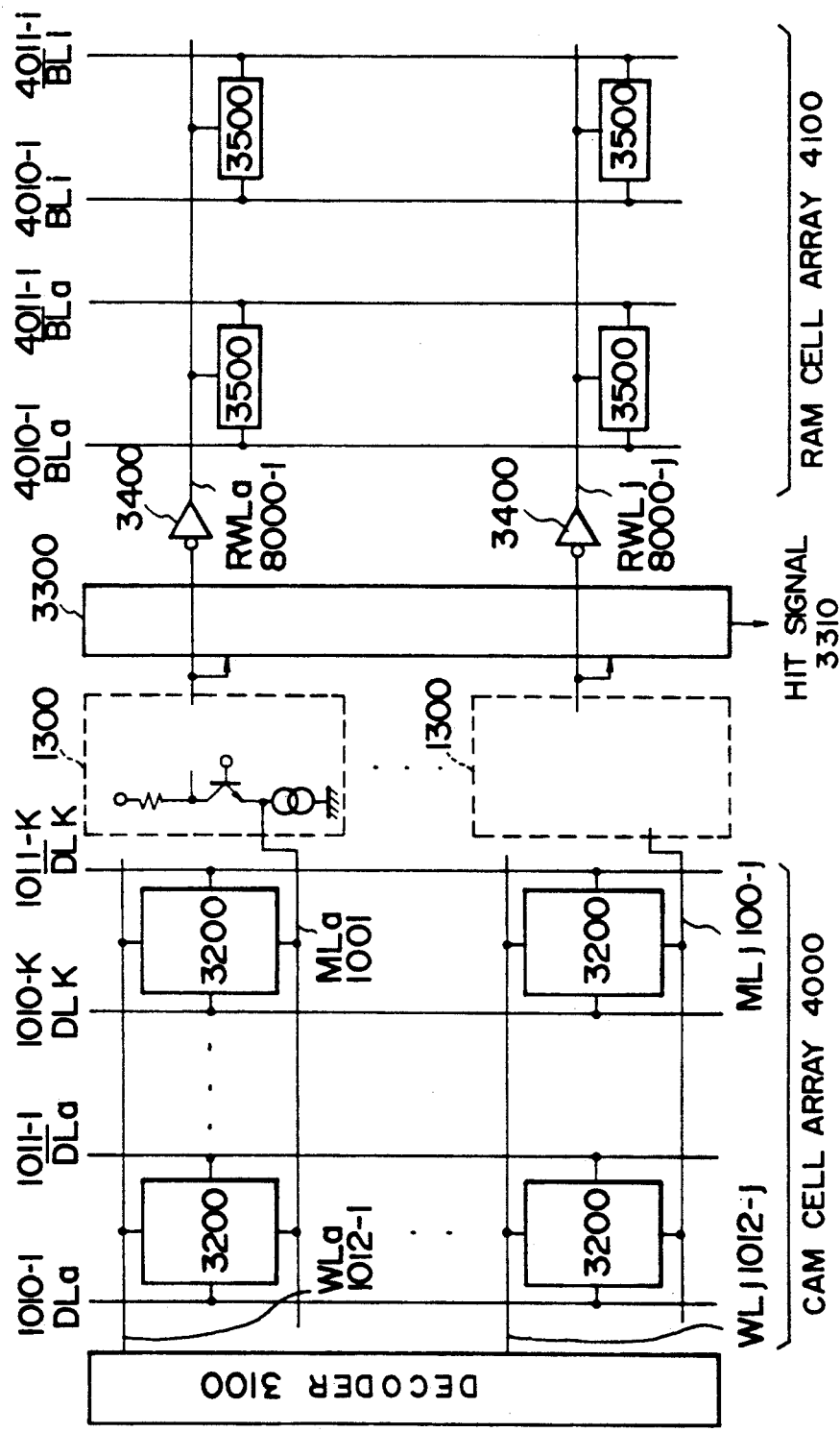
FIG. 13 is a block diagram showing the whole arrangement of a CAM according to the fourth embodiment of the present invention.
Figure 14:
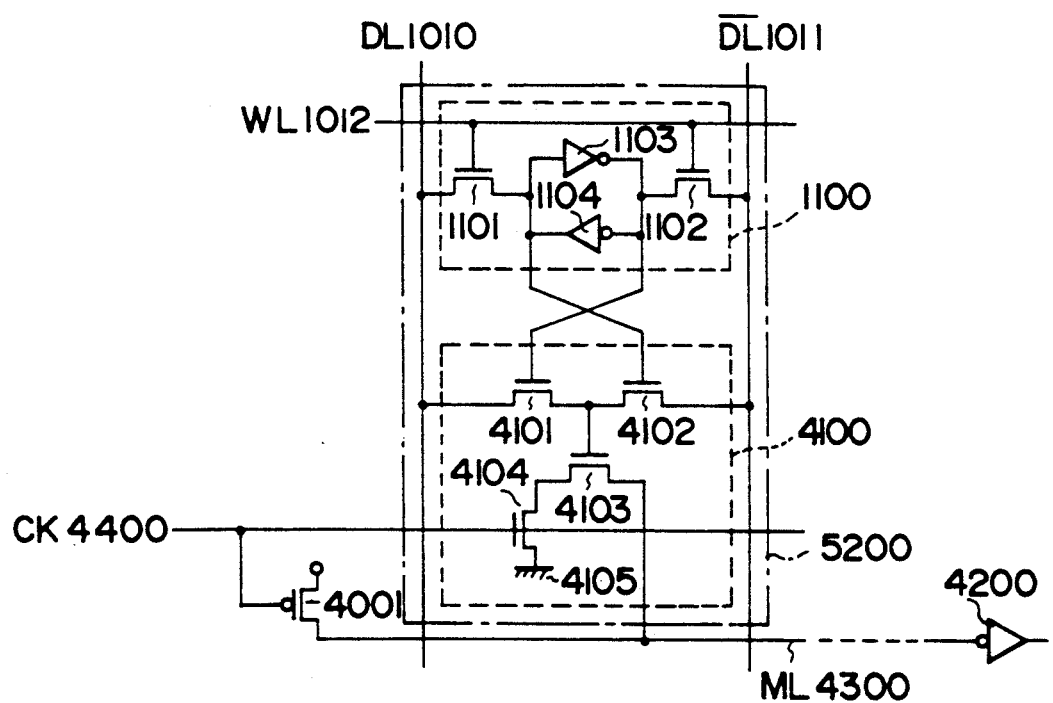
FIG. 14 is a circuit diagram showing the arrangement of a CAM cell in the prior art.

Now, the whole arrangement of the CAM according to this embodiment is shown in FIG. 13.

Referring to FIG. 13, the CAM includes pairs of data lines for CAM cells, DLa 1010-1 and $\overline{DLa}$ 1011-1, . . . , and DLk 1010-k and $\overline{DLk}$ 1011-k; word lines for the CAM cells, Wla 1012-1, . . . , and WLj 1012-j; match lines MLa 1001, . . . , and MLj 100j; pairs of data lines for RAM cells, BLa 4010-1 and $\overline{BLa}$ 4011-1, . . . , and BLi 4010-i and % BLi 4011-i; and word lines for the RAM cells, RWLa 8000-1, . . . , and RWLj 8000-j.

Further, this CAM includes a decoder for the CAM cells, 3100 which selects the corresponding memory cell in accordance with an address afforded as an input and which is used in case of reading or writing data out of or into the CAM cell.

The decoder for the CAM cells, 3100 selects all the memory cells in a search mode.

The CAM cells are shown at numerals 3200. Numeral 1300 indicates each output amplifier. Although the internal circuit arrangement of the output amplifier 1300 is partly omitted from illustration, the output signal thereof is a voltage signal after level conversion. Numeral 3300 represents a hit detection circuit, which generates a hit signal 3310 upon detecting that search data items afforded to the data lines DLa 1010-1~% DLk 1011-k have coincided with the stored contents of all the memory cells belonging to the specified word of a CAM cell array 4000.

Numeral 3400 indicates each word driver, which drives the corresponding word line of a RAM cell array 4100. The RAM cells are shown at numerals 3500.

Search output signals are delivered to the match lines MLa 1001~MLj 100j of those words of the CAM cell array 4000 in which the search data items of the data line pairs DLa 1010-1, $\overline{DLa}$ 1011 1~DLk 1010 k, $\overline{DLk}$ 1011-k have coincided with the stored data items of the memory cells. The search output signals delivered to the match lines MLa 1001~MLj 100j are current signals, while the potentials of these match lines MLa 1001~MLj 100j are clamped by the output amplifiers 1300. The current signals of the match lines are converted by the output amplifiers into the voltage signals, which are supplied to the hit detection circuit 3300 and the word drivers 3400.

The stored data items of the RAM cells 3500 selected by or connected to the word lines for the RAM cells, RWLa 8000-1~RWLj 8000-j driven by the word drivers 3400 are delivered through the data line pairs BLa 4010-1, $\overline{BLa}$ 4011-1~BLi 4010 i, $\overline{BLi}$ 401 1-i.

According to the arrangement shown in FIG. 13, the data search can be done at high speed even in a case where each match line is heavily loaded on account of a large number of CAM cells connected thereto.

Therefore, the generation of the hit signal can be quickened, and the period of time which is expended till the delivery of the RAM cell data after inputting the search data can be shortened.

Incidentally, the CAM of this embodiment as stated above is extensively applicable to the cache memory of a microcomputer, a TLB (Translation Lookaside Buffer) for address conversion, etc.

As described above, according to this embodiment, the potential of the match line which is heavily loaded in proportion to the bit width of the CAM cells is clamped by the output amplifier, so that the voltage thereof can be suppressed to a small amplitude on the order of several tens mV. Besides, the output signals from the CAM cells to the match line are minute current signals, which are quickly amplified by the output amplifier. Therefore, the search operation is less susceptible to the load of the match line. Eventually, the search of the data can be made at high speed irrespective of the bit width which is simultaneously searched.

Accordingly, this embodiment is effective to shorten the periods of time till the generation of the hit detection signal since the inputting of the search data to the CAM and till the delivery of the RAM cell data since the same.

Moreover, the search circuit in the CAM cell may produce the minute current from the sufficient drive voltage as stated before, so that the sizes of the constituent MOSFETs can be reduced.

This brings forth the effects that the CAM cell can be formed into a small size, and that the entire CAM can also be reduced in size.

Furthermore, the maximum value of the quantity of the currents to flow to the match line can be limited by inserting the current limiters in the current paths which extend from the match line to the ground potential through the search circuits. This brings forth the effects that the power consumption is lowered, and that the reliability of the match line against electromigration is enhanced.

Meanwhile, the memory peripheral circuit explained in each of the first thru third embodiments can be utilized as the peripheral circuit of the memory cells of the RAM cell array or CAM cell array of the CAM explained in the fourth embodiment.

Now, as the fifth embodiment of the present invention, there will be described a CAM in the case where the memory peripheral circuit explained in each of the first thru third embodiments is employed as the peripheral circuit of the memory cells of the RAM cell array or CAM cell array of the CAM explained in the fourth embodiment.

FIG. 15 shows the whole arrangement of the CAM according to the fifth embodiment.

As illustrated in the figure, the CAM of the fifth embodiment is such that any of the memory-cell peripheral circuits (refer to FIGS. 1 thru 3) explained in the first thru third embodiments before is added to each of the columns of the CAM cell array and RAM cell array of the foregoing CAM (refer to FIG. 13) according to the fourth embodiment. Besides, the CAM cell array and the RAM cell array are furnished with Y decoders 5000 and 5100 for producing column select signals Ya 5001, ..., and Yk 500k; and Yb 5101, ..., and Yi 510i from parts of addresses afforded as inputs, respectively.

In the CAM cell array, the memory cell 3200 into or from which data is written or read out is selected in such a way that address signals for designating the memory cell to be accessed are applied to an X decoder 3100 and the Y decoder 5000. The operation of writing or reading the data into or out of the selected memory cell is the same as explained in the first-third embodiments before.

On the other hand, in the RAM cell array, the memory cell 3500 into or from which data is written or read out is selected by the hit signal 3310 which is delivered from the hit detection signal 3300, and any of the column select signals Yb 5101 Yi 510i that is delivered from the Y decoder 5100 on the basis of the address signal applied to the Y decoder 5000 in order to designate the column to be-accessed. The operation of writing or reading the data into or out of the selected memory cell is the same as explained in the first-third embodiments before.

As set forth above, according to the present invention, the operating speeds of various semiconductor memories such as RAMs and CAMs can be raised.

What is claimed is:

1. A semiconductor memory comprising:
   a plurality of columns each including a plurality of memory cells and a logic circuit;
   a column select line, associated with each of said plurality of columns, which delivers a column select signal for selecting one of said columns; and
   a plurality of data lines each corresponding to a respective column,
   wherein each of said plurality of data lines is selectively connected to an input/output node of one of the memory cells included in a corresponding one of said plurality of columns when the corresponding column is selected by said column select signal, and
   wherein said logic circuit includes a first transistor for driving the corresponding data line to a "high" level, indicative of a logic "high" level write data written into a selected memory cell of the corresponding column, during a write mode, upon the corresponding column being selected by said column select signal, and a second transistor for driving the corresponding data line to a "low" level, indicative of a logic "low" level write data written into said memory cell, upon the corresponding column being selected by said column select signal, said first and second transistors of each said corresponding column functioning as bit loads of corresponding ones of said data lines when data is read out from said memory cell included in the corresponding column.

2. A semiconductor memory comprising:
   a plurality of columns each including a plurality of memory cells and data lines; and
   column select lines, which deliver a column select signal for selecting one of said columns, coupled to each of said columns,
   wherein each of said plurality of data lines is selectively connected to an input/output node of a memory cell included in a corresponding column upon the corresponding column being selected by said column select signal, and
   wherein each of said columns further includes:
   (i) a driver circuit which drives corresponding ones of said data lines to a level in accordance with a value of write data to be written into a selected memory cell upon the corresponding column being selected by said column select signal, during a write mode; and
   (ii) transistors which function as bit loads when stored data is read out from the selected memory cell included in the corresponding column and which have their ON/OFF states controlled in accordance with the value of the write data when the data is written.

3. A semiconductor memory comprising:
   a plurality of columns each including a plurality of memory cells and data lines;
   column select lines, which deliver a column select signal for selecting one of said columns, coupled to each of said columns; and
   write enable lines which deliver a write enable signal designating a write operation to each of said columns,
   wherein each of said plurality of data lines is selectively connected to an input/output node of one of the memory cells included in a corresponding one of said plurality of columns when the corresponding column is selected by said column select signal, and
   wherein each of said columns further includes:
   a write driver including first MOSFETs respectively coupled to data lines included in the corresponding column and operating, in accordance with said write enable signal for designating a write operation and a value of write data, so as to be in an ON state and pull up a corresponding data line at operating times other than the write operation as designated by said enable signal, to maintain the ON state and pull up the corresponding data line when driving the corresponding data line to a "high" level when the write operation is designated by said enable signal, and to switch into an OFF state when driving the corresponding data line to a "low" level when the write operation is designated by said enable signal; and
   second MOSFETs, respectively coupled to data lines included in the corresponding column and operating, in accordance with said write enable signal, said column select signal and the value of the write data, so as to be controllably set into an OFF state at operating times other than the write operation, as designated by said write enable signal, and to switch into an ON state and lower a potential level of the corresponding data line to that of the "low" level when driving the data line to the "low" level when the write operation is designated by said write enable signal and the corresponding column is selected by said column select signal.

4. A semiconductor memory as defined claim 3, wherein each column consists of a pair of complementary data lines including a noninverting data line associated with a logic level indicative of stored data of said memory cell, and an inverting data line, associated with a logic level indicative of the logic complement of the stored data of said memory cell selectively coupled thereto, said noninverting and inverting data lines are connected to corresponding ones of a pair of input/output nodes of said memory cell, wherein said first MOSFETs consist of two PMOSFETs which are disposed so as to correspond respectively to said noninverting data line and said inverting data line, and wherein the ON/OFF states of said PMOSFET disposed in correspondence with said noninverting data line are controlled using inverted data as a gate signal thereof when the write operation is designated by said write enable signal, the inverted data being obtained by inverting the write data, while the ON/OFF states of said PMOSFET disposed in correspondence with said inverting data line are controlled using the write data as a gate signal thereof when the write operation is designated by said write enable signal.

5. A semiconductor memory as defined in claim 3, wherein each of said columns further includes a column selection deciding circuit which produces a low potential in a case in which the corresponding column is selected by said column select signal, and wherein in the case in which the data line is driven to the low level, one of said second MOSFETs of a column is switched into the ON state to connect the data line with said column selection deciding circuit, thereby to change a potential of the data line to the low potential produced by said column selection deciding circuit.

6. A semiconductor memory comprising:

a plurality of columns each including a plurality of memory cells and data lines;

column select lines, which deliver a column select signal for selecting one of said columns, coupled to each of said columns; and write enable lines which deliver a write enable signal designating a write operation to each of said columns, wherein each of said plurality of data lines is selectively connected to an input/output node of one of the memory cells included in a corresponding one of said plurality of columns when the corresponding column is selected by said column select signal, and wherein each of said columns further includes:

a write driver including first MOSFETs respectively coupled to data lines included in the corresponding column and operating, in accordance with said write enable signal for designating a write operation and a value of write data, so as to be in an ON state and pull up the corresponding data line at operating times other than the write operation as designated by said enable signal, to maintain the ON state and pull up the corresponding data line when driving the corresponding data line to a "high" level when the write operation is designated by said enable signal, and to switch into an OFF state when driving the corresponding data line to a "low" level when the write operation is designated by said enable signal, second MOSFETs, respectively coupled to data lines included in the corresponding column and operating in accordance with said write enable signal, said column select signal and the value of the write data, so as to be controllably set into an OFF state at operating times other than the write operation as designated by said write enable signal, and to switch into an ON state and lower a potential level of the corresponding data line to that of the "low" level when driving the data line to the "low" level when the write operation is designated by said write enable signal and the corresponding column is selected by said column select signal; and read lines which are used for reading out stored data from a selected memory cell of a column, a reading gate circuit which changes into an ON state to connect said data lines of a column with said read lines in a case in which a memory cell of a corresponding column is read out, and a write mode detection circuit which brings said reading gate circuit into an OFF state, unconditionally, in the write mode.

7. A semiconductor memory according to claim 1 provided in a microprocessor.

8. A semiconductor memory according to claim 1 provided in a gate array.

9. A semiconductor memory according to claim 2 provided in a microprocessor.

10. A semiconductor memory according to claim 2 provided in a gate array.

11. A data writing method for a semiconductor memory in which the semiconductor memory includes: a plurality of columns each including a plurality of memory cells and a transistor which is in ON state and functions as a bit load of a data line associated therewith when data is read out from a selected memory cell, included in the corresponding column; a column select line, associated with each of said plurality of columns, which delivers a column select signal for selecting one of said columns; and a plurality of data lines each of which corresponds to a respective column and is selectively connected to an input/output node of respective ones of memory cells included in a corresponding column when the corresponding column is selected by said column select signal, said method comprising the steps wherein:

data to be stored is written into the memory cell by driving the corresponding data line to a "high" or "low" level in accordance with a value of the input data to-be-written, and in a case in which said data lines are driven to the low level, said transistor is brought into an OFF state in accordance with the value of input data to-be-written and the column select signal.

12. A data writing method for a semiconductor memory in which the semiconductor memory includes: a plurality of columns each including a plurality of memory cells and a transistor which is in ON state and functions as a bit load of a data line associated therewith when data is read out from a selected memory cell, included in the corresponding column; column select lines, which deliver a column select signal for selecting one of said columns, provided to each of said columns; and a plurality of data lines each pair of which corresponding to a respective column and being selectively connected to input/output nodes of respective ones of memory cells included in the corresponding column in accordance with selection of the corresponding column by said column select signal, said method comprising the steps wherein:

data to be stored is written into the memory cell by driving the corresponding pair of data lines to a "high" or "low" level in accordance with the value of the input data to-be-written and said column select signal, and each said data line is driven to the high level by the use of a corresponding said transistor, coupled thereto, and each said transistor functioning as said bit load in a case in which said data lines are to be driven to the high level.

13. A semiconductor memory according to claim 4, wherein in each column the corresponding said write driver further includes two NMOSFETs which are disposed so as to correspond respectively to said noninverting data line and said inverting data line, each one of said NMOSFETs is series-connected with a respective PMOSFET of said write driver to effect, in response to actuation by said column select signal, a pull-up and pull-down switching action, in accordance with the level of said write enable signal and the value of said write data when the corresponding column is selected by said column select signal.

* * * * *